(12) United States Patent
Zhou et al.

(10) Patent No.: US 10,103,273 B2
(45) Date of Patent: Oct. 16, 2018

(54) SEMICONDUCTOR STRUCTURE

(71) Applicant: UNITED MICROELECTRONICS CORP., Hsin-Chu (TW)

(72) Inventors: Zhibiao Zhou, Singapore (SG); Shao-Hui Wu, Singapore (SG); Chi-Fa Ku, Kaohsiung (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/447,081

(22) Filed: Mar. 1, 2017

(65) Prior Publication Data

US 2017/0179295 A1 Jun. 22, 2017

Related U.S. Application Data

(62) Division of application No. 14/724,799, filed on May 28, 2015, now Pat. No. 9,627,547.

(30) Foreign Application Priority Data

Apr. 30, 2015 (CN) .......................... 2015 1 0216493

(51) Int. Cl.
*H01L 29/10* (2006.01)
*H01L 29/786* (2006.01)
*H01L 29/24* (2006.01)
*H01L 29/04* (2006.01)
*H01L 29/49* (2006.01)
*H01L 29/51* (2006.01)
*H01L 29/06* (2006.01)

(52) U.S. Cl.
CPC ........ *H01L 29/7869* (2013.01); *H01L 29/045* (2013.01); *H01L 29/0649* (2013.01); *H01L 29/24* (2013.01); *H01L 29/4916* (2013.01); *H01L 29/517* (2013.01)

(58) Field of Classification Search
CPC ............... H01L 29/7869; H01L 29/045; H01L 29/0649; H01L 29/24; H01L 29/4916; H01L 29/517
See application file for complete search history.

(56) References Cited

U.S. PATENT DOCUMENTS

| 2013/0020575 | A1 | 1/2013 | Ishizuka |
| 2013/0161621 | A1 | 6/2013 | Isobe |
| 2013/0187161 | A1 | 7/2013 | Yamazaki |
| 2014/0339548 | A1 | 11/2014 | Yamazaki |
| 2015/0021603 | A1 | 1/2015 | Isobe |

*Primary Examiner* — Dale E Page
*Assistant Examiner* — Colleen E Snow
(74) *Attorney, Agent, or Firm* — Winston Hsu

(57) ABSTRACT

A semiconductor structure includes a substrate and a first element disposed in the substrate and arranged along a first direction. The first element is made of a semiconductor oxide material. The semiconductor structure also includes a dielectric layer disposed on the first element, and a second element, disposed on the dielectric layer and arranged along the first direction. The second element is used as a gate of a transistor structure.

9 Claims, 8 Drawing Sheets

SEMICONDUCTOR STRUCTURE

CROSS REFERENCE TO RELATED APPLICATIONS

This application is a divisional application of U.S. patent application Ser. No. 14/724,799 filed May 28, 2015, which is herein incorporated by reference in its entirety.

BACKGROUND OF THE INVENTION

1. Field of the Invention

The present invention relates generally to a semiconductor structure and, more particularly, to a semiconductor structure combined with IGZO (In—Ga—Zn Oxide) materials.

2. Description of the Prior Art

Attention has been focused on a technique for formation of a transistor using a semiconductor thin film formed over a substrate having an insulating surface. The transistor is used in a wide range of electronic devices such as an integrated circuit (IC) and an image display device (display device). A silicon-based semiconductor material is widely known as a material for a semiconductor thin film applicable to a transistor, and within which, oxide semiconductor containing indium (In), gallium (Ga), and zinc (Zn) has been attracting attention.

A transistor including an oxide semiconductor film is known to have an extremely low leakage current in an off state. Nevertheless, current architecture of integrating transistor having oxide semiconductor film with metal-oxide semiconductor (MOS) transistor is still insufficient in bringing out optical performance of the device. Hence, how to improve the current fabrication flow for integrating oxide semiconductor transistor with MOS transistor has become an important task in this field.

SUMMARY OF THE INVENTION

The present invention provides a semiconductor structure, comprising a substrate, a first element disposed in the substrate and arranged along a first direction, wherein the first element is made of an oxidation semiconductor material, a dielectric layer disposed on the first element, and a second element disposed on dielectric layer and arranged along the first direction, wherein the second element is used as the gate structure of a transistor structure.

The present invention further provides a semiconductor structure, comprising a substrate, having an isolation region disposed therein, a first element disposed in the isolation region and arranged along a first direction, wherein the first element is made of an oxidation semiconductor material, a dielectric layer disposed on the first element, and a second element disposed on dielectric layer and arranged along a second direction, wherein the second element is used as the gate structure of a transistor structure.

The transistor structures of the present invention care combined with the oxidation semiconductor materials, especially with IGZO or CAAC-IGZO. Since IGZO or CAAC-IGZO have higher mobility than silicon, the leakage current of a transistor structure made of IGZO is extremely low when the transistor structure is under off state. In this way, the transistor structure has low power consumption advantage. In summary, the present invention uses the IGZO or CAAC-IGZO to replace the channel region of a transistor structure, thereby improving the performance of the transistor structure effectively.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
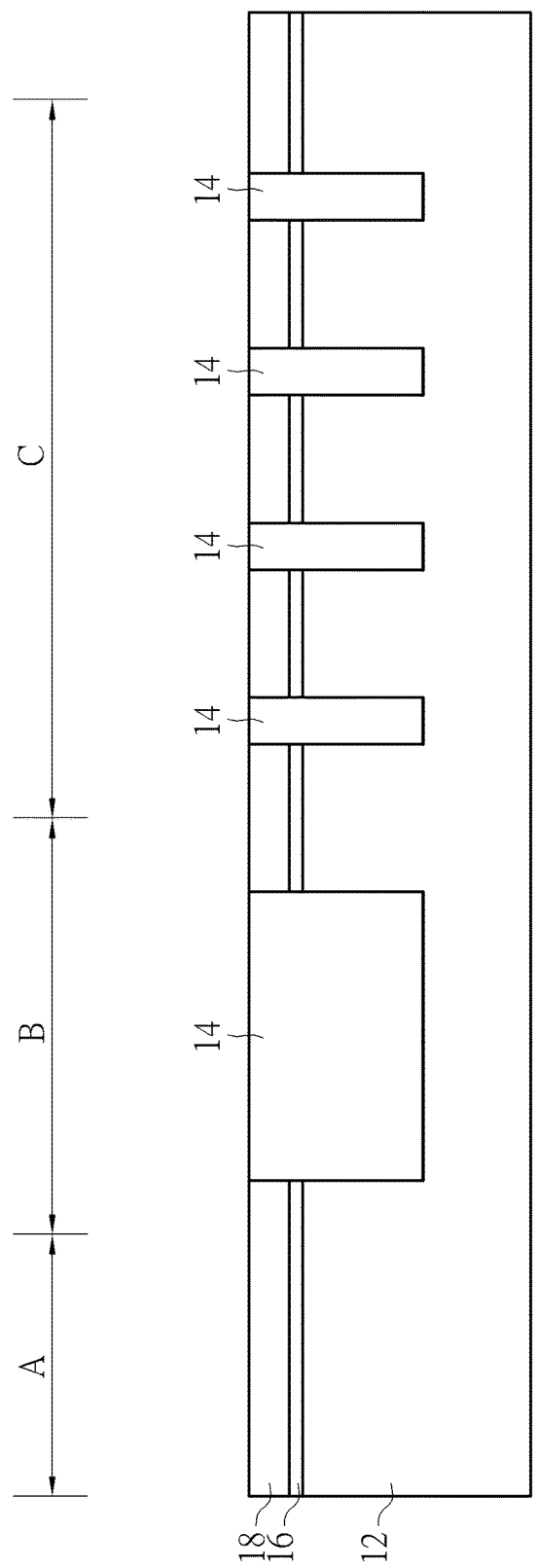
FIGS. 1-6 illustrate a method for fabricating a semiconductor structure according to a preferred embodiment of the present invention.

Please refer to FIGS. 1-6, FIGS. 1-6 illustrate a method for fabricating a semiconductor structure according to a preferred embodiment of the present invention. As shown in FIG. 1, a substrate 12 is provided, in which the substrate 12 could be a silicon substrate, epitaxial substrate, silicon carbide substrate, or silicon-on-insulator (SOI) substrate, but is not limited thereto. In this embodiment, a first region A, a second region B and a third region C are defined on the substrate 12, wherein the transistor structure according to the first preferred embodiment of the present invention will be formed within the first region A in the following steps; the transistor structure according to the second preferred embodiment of the present invention will be formed within the second region B in the following steps; and a conventional transistor structure will be formed within the third region C, used for comparing the transistor structures within the first region A or within the second region B.

It is noteworthy that in the paragraph above, the first region A, the second region B and the third region C are defined on the substrate simultaneously, however, the present invention does not need to comprise the first region A, the second region B and the third region C simultaneously. In other words, if a structure only comprises the transistor structure disposed within the first region A or only comprises the transistor structure disposed within the second region B, it should also be within the scope of the present invention. It will not be noted again in the following paragraphs.

According to an embodiment of the present invention, a plurality of doped wells (not shown) and/or isolation regions 14 could be formed in the substrate 12, the isolation region such as the shallow trench isolations (STI). Besides, a dielectric layer is preferably formed on the substrate 12, and the dielectric layer may be a single layer structure or a multiple layers structure. In this embodiment, the dielectric layer includes a silicon oxide layer 16 and a silicon nitride layer 18, but is not limited thereto, the material of the dielectric layer can be adjusted according to actual requirements. In addition, the dielectric layer may comprise the hard mask and the etching stop layer during the process for forming the isolation region 14.

Also, it should be noted that even though the fabrication process of this embodiment pertains to a planar type transistor, the fabrication process could also be applied to non-planar transistor such as FinFET, and in such instance, the element 12 shown in FIG. 1 would then become a fin-shaped structure on a substrate. In this case, the dielectric layer mentioned above can used as the hard mask for forming the fin-shaped structure and the etching stop layer for forming the isolation region 14.

Figure 2:
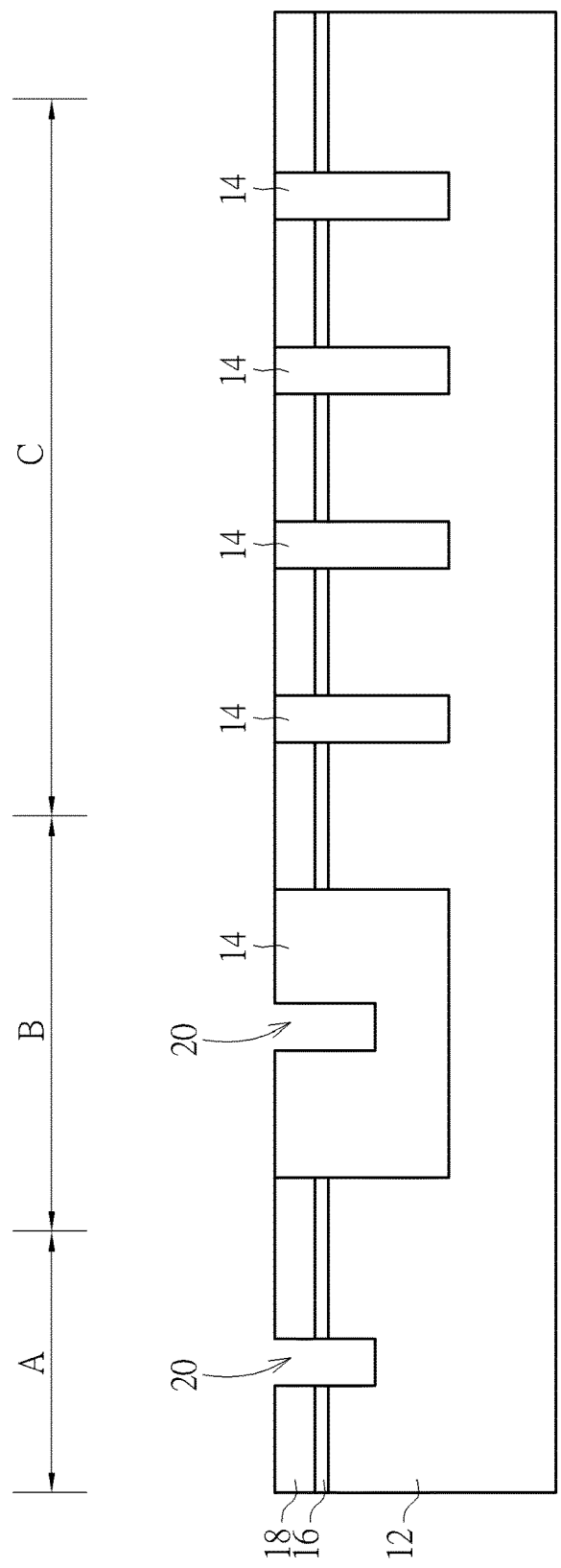

Next, as shown in FIG. 2, at least one recess 20 is formed in the substrate 12 within the first region A and within the isolation region 14 within the second region B respectively. The recess 20 can be formed through an etching process, but is not limited thereto.

Figure 3:
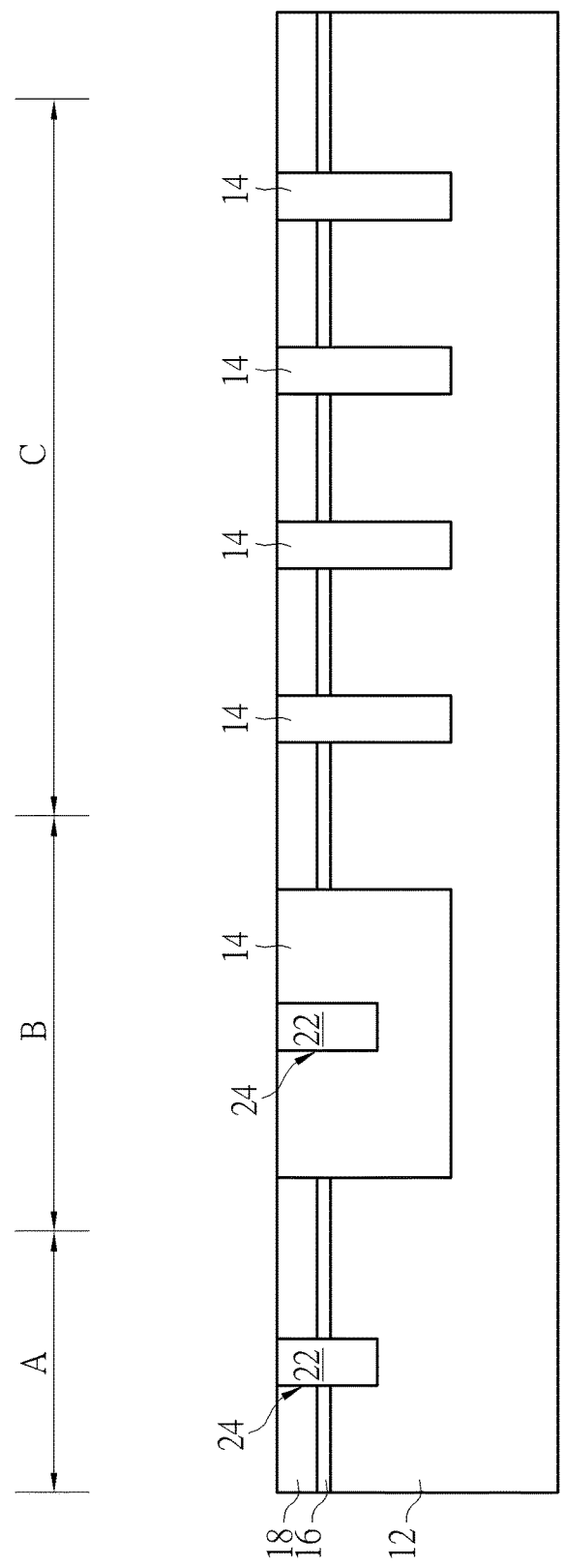

As shown in FIG. 3, an oxidation semiconductor material 22 is then filled in each recess 20 within the first region A and within the second region B. Each recess 20 is filled by the oxidation semiconductor material 22, so as to form a plurality of first elements 24. The oxidation semiconductor material mentioned above comprises In—Ga—Zn oxide (IGZO) or c-axis aligned crystal IGZO, (CAAC-IGZO). Next, a planarization process is performed, such as a chemical mechanical polishing (CMP) process, to remove the extra oxidation semiconductor material 22 on the dielectric layer (the silicon nitride layer 18), and to form a flat surface.

Figure 4:
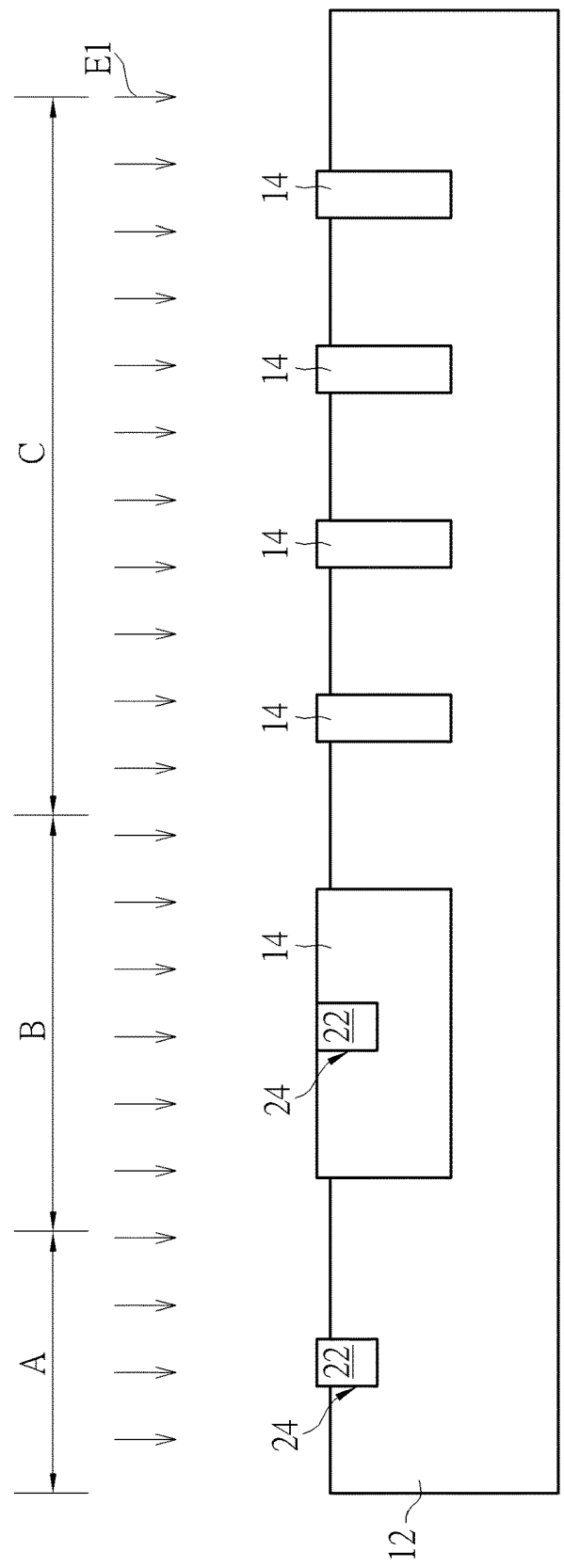
Figure 5:
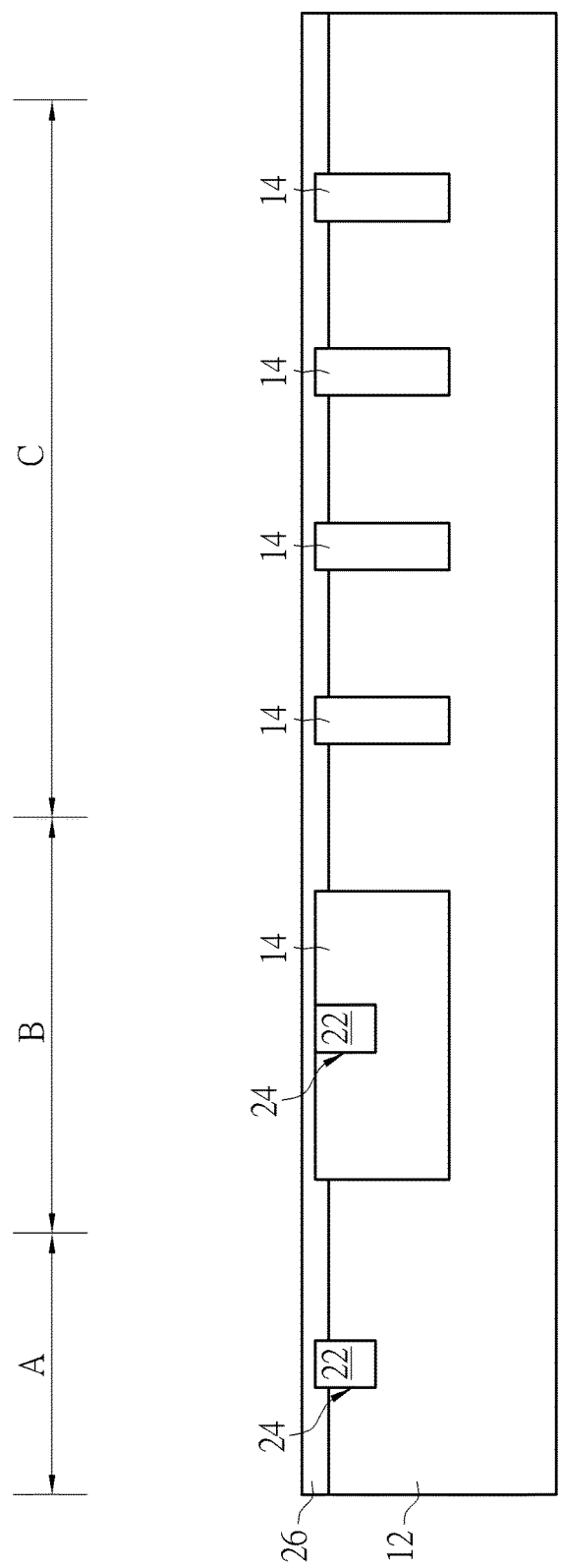

As shown in FIGS. 4-5, an etching back process E1 is performed, to remove the silicon oxide layer 16 and the silicon nitride layer 18. Preferably, the top surface of the substrate 12 is exposed, and at this time, the top surface of each first element 24 is higher than the top surface of the substrate 12. Afterwards, as shown in FIG. 5, an oxide layer 26 is then deposited on the substrate 12, and covering each first element 24. The oxide layer 26 such as aluminum oxide ($Al_2O_3$), gallium oxide ($Ga_2O_3$), and $HfO_2$, but is not limited thereto. The oxide layer 26 can protect the first element 24 disposed below, thereby avoiding the destruction of the first elements 24 in the following steps. Furthermore, the oxide layer 26 can be used as the gate dielectric layer of a transistor structure, in other words, used as the dielectric layer which separates the gate region and the channel region from each other.

Figure 6:
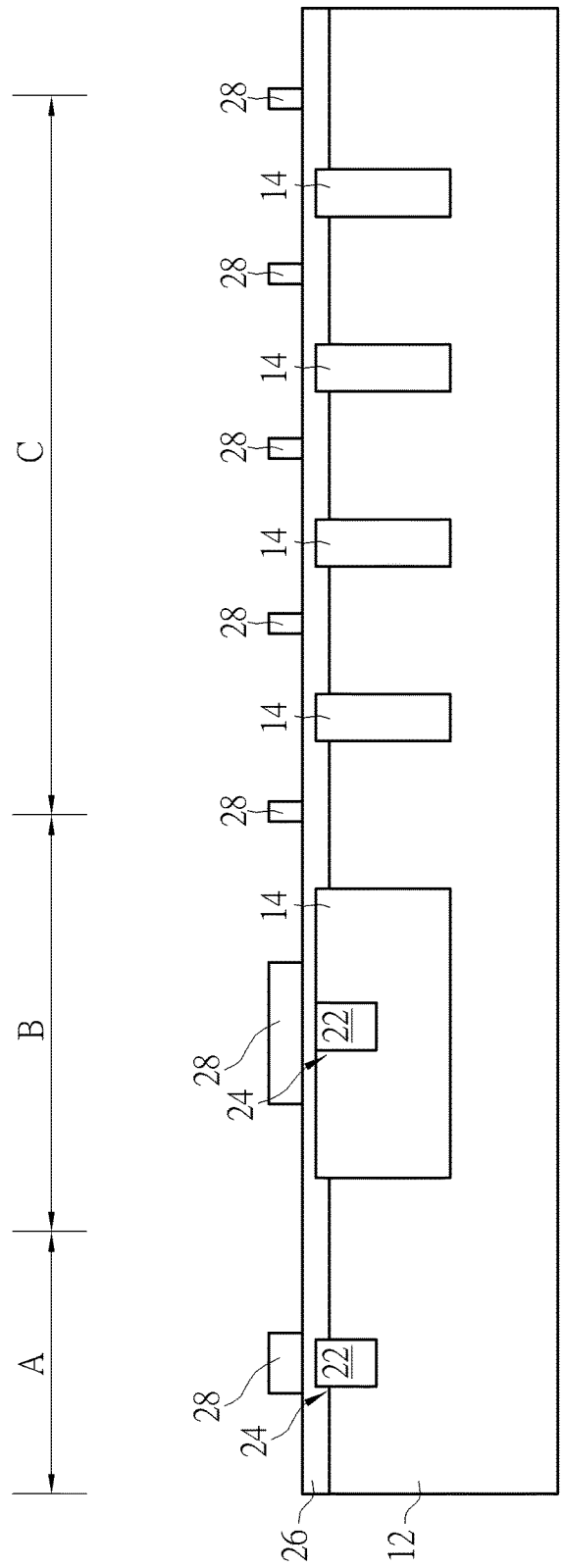

As shown in FIG. 6, a plurality of second elements 28 are formed within the first region A, the second region B and the third region C. More precisely, the second elements 28 are used as the gate structures of a transistor device, covering on the oxide layer 26, and the material of the second element 28 may include polysilicon or metals. In addition, the manufacturing process for forming the second element 28 may be formed through a gate first process, a gate last high-k first process, or a gate last high-k last process. Those processes mentioned above are well known to those skilled in the art, and will not be described in detail here.

Figure 6A:
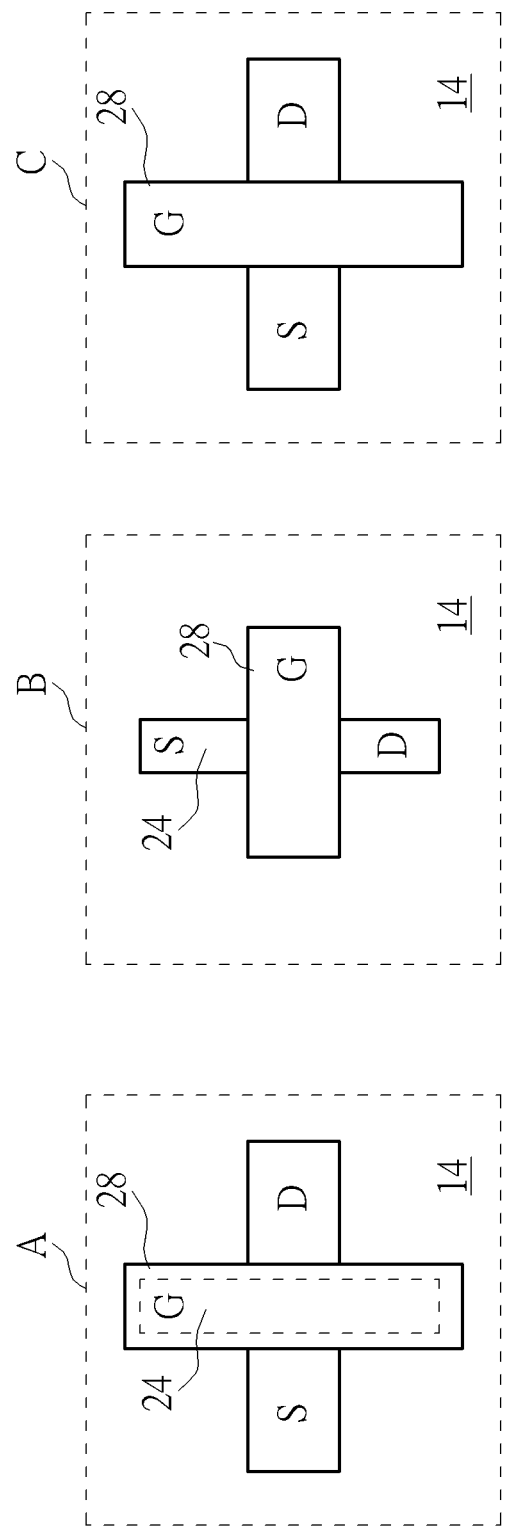
FIG. 6A shows the top view diagrams within the first region A, the second region B and parts of the third region C of FIG. 6.

In addition, FIG. 6A shows the top view diagrams within the first region A, the second region B and parts of the third region C of FIG. 6. As shown in FIG. 6, within the first region A, both the first element 24 and the second element 28 (gate structure) are arranged along a first direction (such as Y-axis). Preferably, the area of the second element 28 is larger than the area of the first element 24. Therefore, when viewed in a top view, the second element 28 totally covers the first element 24. And the source/drain (S/D) regions or the epitaxial layer (not shown) are formed in the substrate 12 disposed on two sides of the second element 28. It is noteworthy that when viewed in cross section views (such as FIGS. 1-6), even though the isolation region 14 is shown only within the second region B, and not shown within the first region A, actually as shown in FIG. 6A, the isolation region 14 is disposed in the substrate and surrounding outside of the source/drain region.

In the present invention, please refer to FIG. 6 and FIG. 6A, two different transistor structures are formed within the first region A and within the second region B respectively, and both of the transistor structures are combined with IGZO materials. In other words, both of them comprise the first element 24 made of IGZO or CAAC-IGZO, and the first element 24 at least disposed in the channel region of the transistor structure, namely disposed between the source region and the drain region. Take the transistor structure within the first region A (the first preferably embodiment of the present invention) as an example, the second element 28 is used as the gate structure, disposed on the oxide layer 26, and the source/drain regions are formed through implanting the substrate 12 disposed on two sides of the second element 28. In this embodiment, the first element 24 is disposed in the substrate 12, directly contacting the substrate 12, and disposed between the source region S and the drain region D, to be used as the channel region of the transistor structure. IGZO (or CAAC-IGZO) has higher mobility than silicon substrate does, thereby increasing the performance of the transistor structure. Afterwards, the transistor structure can be combined with some semiconductor manufacturing processes, such as forming the interlayer dielectric (ILD), performing the silicide layer, forming the contact plugs, etc. The processes mentioned above are well known to those skilled in the art, and will not be described in detail here.

Figure 7A:
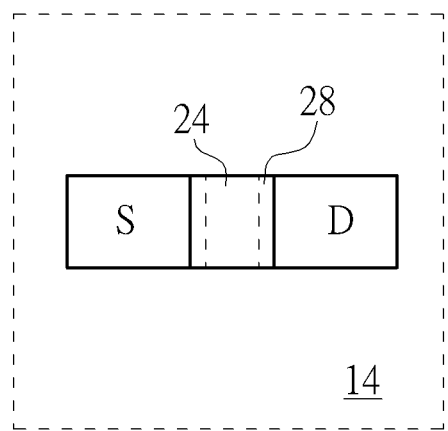
FIG. 7A shows the top view within the first region A according to another embodiment of the present invention.

In addition, FIG. 7A shows the top view within the first region A according to another embodiment of the present invention. The difference between this embodiment and the transistor structure shown in FIG. 6A is the first element 24 is only disposed between the source region S and the drain region D, and does not extend to the isolation region 14 surrounding outside. The structure should also be within the scope of the present invention. Others features of this embodiment are same as those described above, and will not be redundantly described here.

Please refer to FIG. 6A again, showing the transistor structure within the second region B (the second embodiment of the present invention). The difference between this transistor structure and the transistor structure of the first preferred embodiment is that in this embodiment, the isolation region 14 is disposed in the substrate 12, and the first element 24 is disposed in the isolation region 14, arranged along the first direction (such as Y-axis), and the second element 28 crosses over the first element 24, arranged along a second direction (such as X-axis). Preferably, the second element 28 and the first element 24 are arranged orthogonally. Besides, when viewed in cross section views (FIG. 6), the top surface of the isolation region 14 and the top surface of the first element 24 are on a same level, and the top surface of the first element 24 is higher than the top surface of the substrate 12. In this embodiment, the second element 28 is disposed on the oxide layer 26 and used as the gate structure of a transistor structure, and the first element 24 disposed on two sides of the second element 28 is then implanted, so as to form the source region S/drain region D. In addition, the first element 24 disposed right below the second element 28, namely the intersection of the second element 28 and the first element 24 is used as the channel region of the transistor structure.

Compared with conventional transistor structures, such as the transistor structure formed within the third region C, the transistor structures of the present invention combined with the oxidation semiconductor materials, especially with IGZO or CAAC-IGZO, has advantages. Since IGZO or CAAC-IGZO have higher mobility than silicon, and the leakage current of a transistor structure made of IGZO is extremely low when the transistor structure is under off state, the transistor structure has low power consumption. In summary, the present invention uses the IGZO or CAAC- IGZO to replace the channel region of a transistor structure, thereby improving the performance of the transistor structure effectively.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor structure, comprising:
   a substrate, having an isolation region disposed therein;
   a first element disposed in the isolation region and arranged along a first direction, wherein the first element is made of an oxidation semiconductor material;
   a dielectric layer disposed on the first element, wherein parts of the dielectric layer contacts the substrate directly; and
   a second element disposed on dielectric layer and arranged along a second direction, wherein the second element is used as the gate structure of a transistor structure.

2. The semiconductor structure of claim 1, wherein the oxidation semiconductor material of the first element includes In—Ga—Zn oxide (IGZO).

3. The semiconductor structure of claim 2, wherein the IGZO further comprises c-axis aligned crystal IGZO (CAAC-IGZO).

4. The semiconductor structure of claim 1, wherein the material of the second element includes polysilicon.

5. The semiconductor structure of claim 1, wherein a top surface of the first element is higher than a top surface of the substrate.

6. The semiconductor structure of claim 1, wherein the material of the dielectric layer includes aluminum oxide or gallium oxide.

7. The semiconductor structure of claim 1, wherein the second direction is perpendicular to the first direction.

8. The semiconductor structure of claim 1, wherein a top surface of the isolation region and a top surface of the first element are on a same level.

9. The semiconductor structure of claim 1, wherein parts of the first element are disposed between a source region and a drain region of the transistor structure.

* * * * *